US006304995B1

(12) United States Patent
Smith et al.

(10) Patent No.: US 6,304,995 B1
(45) Date of Patent: Oct. 16, 2001

(54) PIPELINED ARCHITECTURE TO DECODE PARALLEL AND SERIAL CONCATENATED CODES

(75) Inventors: Ronald P. Smith, Redondo Beach; Oliver W. Saunders, Los Angeles, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/237,714

(22) Filed: Jan. 26, 1999

(51) Int. Cl.[7] .................................................. H03M 13/03
(52) U.S. Cl. ............................................ 714/786; 714/796
(58) Field of Search .................................... 714/786, 794, 714/796, 792; 375/259, 265, 340

(56) References Cited

U.S. PATENT DOCUMENTS

| | | | |
|---|---|---|---|
| 4,730,322 | * 3/1988 | Pollara-Bozzola | 714/792 |
| 5,446,747 | * 8/1995 | Berrou | 714/788 |
| 5,721,745 | * 2/1998 | Hladik et al. | 714/786 |
| 5,729,560 | * 3/1998 | Hagenauer et al. | 714/786 |
| 5,761,248 | * 6/1998 | Hagenauer et al. | 375/340 |
| 5,983,385 | * 11/1999 | Khayrallah et al. | 714/755 |
| 5,996,104 | * 11/1999 | Herzberg | 714/755 |
| 6,014,411 | * 1/2000 | Wang | 375/259 |
| 6,023,783 | * 2/2000 | Divsalar et al. | 714/792 |
| 6,028,897 | * 2/2000 | Wang | 375/265 |
| 6,044,116 | * 3/2000 | Wang | 375/265 |

OTHER PUBLICATIONS

D. Divsalar and F. Pollara, "On the Design of Turbo Codes", Communications Systems and Research Section, TDA Progress Report 42–123, Jet Propulsion Lab, NASA, Nov. 15, 1995.*

S. Benedetto, D. Divsalar, G. Montorsi, and F. Pollara, Soft–Output Decoding Algorithms in Iterative Decoding of Turbo Codes, TDA Progress Report 42–124, Jet Propulsion Lab, NASA, Feb. 15, 1996.*

S. Benedetto, D. Divsalar, G. Montorsi, and F. Pollara, "A Soft–Input Soft–Output Maximum A Posteriori (MAP) Module to Decode Parallel and Serial Concatenated Codes", TDA Progress Report 42–127, Jet Propulsion Lab, NASA, Nov. 15, 1996.*

(List continued on next page.)

*Primary Examiner*—Albert Decady
*Assistant Examiner*—Joseph D. Torres
(74) *Attorney, Agent, or Firm*—McAndrews, Held & Malloy

(57) ABSTRACT

The present invention provides a method and apparatus (400) for iteratively decoding data which has been encoded with contatenated codes. The apparatus (400) includes pipelined and cascaded decoder processors (406, 430 and 436) connected to a multiple block memory device (402), through a multiplexing and data control block (404). A data decision element (437) is provided for generating decoded output data. The method includes receiving encoded data (802) while data already received is processed iteratively by decoder processors in a pipelined fashion. Decoder processors are designated to perform particular iterations (810) of an iterative decoding process which are performed simultaneously. As a decoder processor completes processing its designated iteration on a block of data, the decoder processor outputs decoding information (808) to the decoding processor designated to perform the subsequent iteration. Upon completion of all iterations for a block of data, the method includes generating output (814) consisting of the decoded data block. The method provides that once processing is complete on a data block, the memory block is made available (816) for the storing of new encoded input data.

18 Claims, 6 Drawing Sheets

OTHER PUBLICATIONS

D. Divsalar and F. Pollara, "Multiple Turbo Codes for Deep–Space Communications", Communications Systems and Research Section, TDA Progress Report 42–121, Jet Propulsion Lab, NASA, May 15, 1995.*

D. Raphaeli anfd Y Zarai, "Combined Turbo Equalization and Turbo Decoding", IEEE, 1997.*

V. Franz and J. Anderson, "Concatenated Decoding with a Reduced–Search BCJR Algorithm", IEEE 1998.*

L. Papke and K. Fazel, "Combined Multilevel Turbo–code with MR–modulation", IEEE, 1995.*

S. Benedetto, D. Divsalar, G. Montorsi, and F. Pollara, "A Soft–Input Soft–Out–put APP Module for Iterative Decoding of Concatenated Codes", IEEE, 1997.*

D. Divsalar and F. Pollara, "Hybrid Concatenated Codes and Iterative Decoding", Communications Systems and Research Section, TDA Progress Report 42–130, Jet Propulsion Lab, NASA, Aug. 15, 1997.*

Blazek Z et al: "A DSP–Based Implementation of a Turbo–Decoder" IEEE Global Telecommunications Conference, US, New York, NY; IEEE, 1998, pp. 2751–2755, XP000801545 ISBN: 0–7803–4985–7, p. 2751, right–hand col., line 6–p. 2752, left–hand col., line 10; figure 1, p. 2753, paragraph 4–last paragraph.

Sklar B; "Turbo Code Concepts Made Easy, or How I Learned to communicate and Reiterate" Annual Military Communications Conference, US, New York, NY: IEEE, 1997, pp. 20–26, XP000799643 ISBN: 0–7803–4250–X.

Benedetto, S., Divsalar, D., Montorsi, G., and Pollara F., "Continuous Map Algorithms and Their Applications to Decode Pareallel and Serial Code Concatenations", Proceedings of the Fifth European Space Agency Workshop on Digital Signal Processing Techniques Applied to Space Communications, Sep. 1996, pp. 8.10–8.24.

* cited by examiner

PIPELINED ARCHITECTURE TO DECODE PARALLEL AND SERIAL CONCATENATED CODES

BACKGROUND OF THE INVENTION

The present invention generally relates to the decoding of parallel and serial concatenated codes. More specifically, the present invention relates to a pipelined architecture and method for iteratively decoding parallel and serial concatenated codes in order to minimize the effects of decoding processing speed on overall data communication rate.

Data signals, in particular those transmitted over a typically hostile RF interface, are susceptible to errors caused by interference. Various methods of error correction coding have been developed in order to minimize the adverse effects that a hostile interface has on the integrity of communicated data. This is also referred to as lowering the Bit Error Rate (BER), which is generally defined as the ratio of incorrectly received information bits to the total number of received information bits. Error correction coding generally involves representing digital data in ways designed to be robust with respect to bit errors. Error correction coding enables a communication system to recover original data from a signal that has been corrupted. Typically, the greater the expected BER of a particular communication link, the greater the complexity of the error correction coding necessary to recover the original data. In general, the greater the complexity of the error correction coding, the greater the inefficiency of the data communication. The greater inefficiency results from a reduction of the ratio of information bits to total bits communicated as the complexity of the error correction coding increases. The additional information introduced into the original body of data by error correction coding consumes spectrum bandwidth and processor cycles on both the transmitting and receiving ends of the communication.

In cases where the expected BER of a particular communication link is substantially higher than the acceptable BER, a concatenated set of error correcting codes may be applied to the data in order to lower the BER to acceptable levels. Concatenated error correction coding refers to sequences of coding in which at least two encoding steps are performed on a data stream. Concatenated coding may be performed in series, where encoded data is subjected to further encoding, or in parallel where the original data is subjected to different encoding schemes to perform intermediate codes which are then further processed and combined into a serial stream.

For example, in serially concatenated coding, where two error correction codes are concatenated, an "outer code" is applied to the original data followed by an "inner code" which is then applied to the original data already encoded with the outer code. Serially concatenated coded data may become quite complex, even in an error correction scheme involving the application of only two concatenated error correction codes. An outer code may take the form of a block code, such as a Reed-Solomon code, and an inner code may take the form of a convolutional code.

Reed-Solomon block codes are organized on the basis of groups of bits referred to as symbols. To form symbols, an incoming serial bit stream may be stored as sequences of m individual bits (a symbol). The Reed-Solomon code has k information symbols (rather than bits), r parity symbols, and a total codeword length of n=k+r symbols. For 8-bit symbols, a Reed-Solomon codeword is typically 255 symbols in length. Allowing the codeword to correct up to 16 symbols requires 32 parity symbols, thereby leaving 223 data symbols (for an effective code rate of 223/255 (approximately 7/8)).

A convolutional code is a type of error correcting code which transforms an input sequence of bits into an output sequence of bits through the use of a finite-state machine, where additional bits are added to the data stream to allow for error-correcting capability. Typically the amount of error-correction capability is proportional to the amount of additional bits added and the amount of memory preset in the finite-state machine encoder. The constraint length, K, of a convolutional code is proportional to the finite-state machine's memory, and the rate of the convolutional code (e.g. m/n with m<n) describes how many additional bits are added for every m information bits input (i.e., n−m bits added for each m information bits). The decoding complexity of a convolutional code increases exponentially with the constraint length.

Next consider an example of a parallel concatenated turbo coding scheme. A block of data may be encoded with a particular coding method resulting in systematic bits and parity bits. Additionally, the original block of data may be rearranged with a permuter and then encoded with the same method as that applied to the original data resulting in systematic bits (which may be discarded) and parity bits. The two sets of encoded data are then further processed and merged into a serial bit stream. As with the case of serially concatenated coding, the complexity of parallel concatenated coding depends on the chosen encoding scheme, and can become significantly complex.

From the previous discussion, it is apparent that data encoded with a convolutional error correction coding scheme may become quite complex, even with only two levels of convolutional encoding. The amount of processing necessary to decode such convolutionally encoded data can be considerable.

Parallel and serial concatenated codes are sometimes decoded using iterative decoding algorithms. One commonly employed method of iterative decoding utilizes a single decoder processor where the decoder output metrics are fed back to the input of the decoder processor. Decoding is performed in an iterative fashion until the desired number of iterations have been performed. In order for the decoder processor to decode the encoded input data at the same rate as the input data is arriving, the decoder processor must process the encoded data at a rate faster than the rate of the incoming data by a factor at least equal to the number of iterations necessary. With this method of iterative decoding, the speed of the decoder processor becomes a significantly limiting factor in the system design.

Another method of iterative decoding utilizes a number of decoder processors equal to the number of processing iterations necessary, each decoder processor operating independently and in parallel with the others. Each decoder processor iteratively decodes its own block of data from start to finish. The decoder processors take turns processing incoming blocks of data. For example, in a system with three independent decoders operating in parallel, decoder one may decode blocks n, n+3, n+6, etc., decoder two may decode blocks n+1, n+4, n+7, etc., and decoder three may decode blocks n+2, n+5, n+8, etc. Each decoder processor may either have multiple blocks of dedicated memory or a complex multiplexing/demultiplexing scheme allowing decoder processors to share memory. Each parallel decoder processor also has its own data decision element. The outputs from the parallel decoder processors are multiplexed to form a serial bit stream. It is apparent from the above discussion that with the parallel decoder processor method of iterative decoding, the quantity of hardware necessary to implement the method becomes a significantly limiting factor in the system design.

The need to maximize processing speed and minimize hardware requirements exists in the communications industry. For example, nowhere is this need more apparent than in satellite communications systems where relatively large amounts of data are to be processed by relatively small amounts of hardware. The data throughput rate in satellite communications systems is constantly pushing the envelope of processing speed. However, there is also a great need to minimize the amount of payload hardware because of cost, weight, power consumption, and reliability concerns. Thus, there exists a need in the communications industry for an improved method of decoding data that maximizes processing speed while minimizing the amount of hardware required.

SUMMARY OF THE INVENTION

It is an object of the present invention to provide an improved scheme for iteratively decoding data encoded with concatenated codes.

It is another object of the present invention to provide a pipelined scheme for decoding data encoded with concatenated codes utilizing cascaded decoder processors.

It is yet another object of the present invention to provide a pipelined scheme for decoding data encoded with concatenated codes utilizing cascaded decoder processors, each of which process an iteration or subset of the total number of iterations, for iteratively decoding the encoded data.

A preferred embodiment of the present invention provides an apparatus and method for iteratively decoding data. The apparatus includes pipelined and cascaded decoder processors, each of which perform an iteration, or subset of the total iterations, of an iterative decoding scheme. Also included is a multiple block memory device which stores the input encoded data while the data is being processed by the decoder processors. The input encoded data is stored in blocks so that individual input encoded data blocks may be selectively accessed by different decoder processors. Multiplexers are implemented to provide the decoder processors selective access to specific input encoded data blocks. A data decision element is provided for generating decoded output data and is connected to the output of the last decoder processor in the cascade of decoder processors.

The method for iteratively decoding data includes receiving blocks of encoded input data into available memory blocks while cascaded decoder processors are simultaneously performing their respective decoding iterations on encoded data previously received and stored in occupied data blocks. Upon completion of their respective decoding iterations, the decoder processors provide output information, also known as metrics, to their respective successor decoder processors in the cascade. The decoder processors then proceed to perform their respective iterations on their next respective blocks of encoded input data based on metrics that have been received from their respective predecessor decoder processors in the cascade. The method further includes generating output decoded data with a data decision element based on metrics information received from the last decoder processor in the cascade. Once the encoded input data stored in a memory block has been decoded, the memory block is made available to store new incoming encoded data.

DETAILED DESCRIPTION OF THE PREFERRED EMBODIMENT

Figure 1:
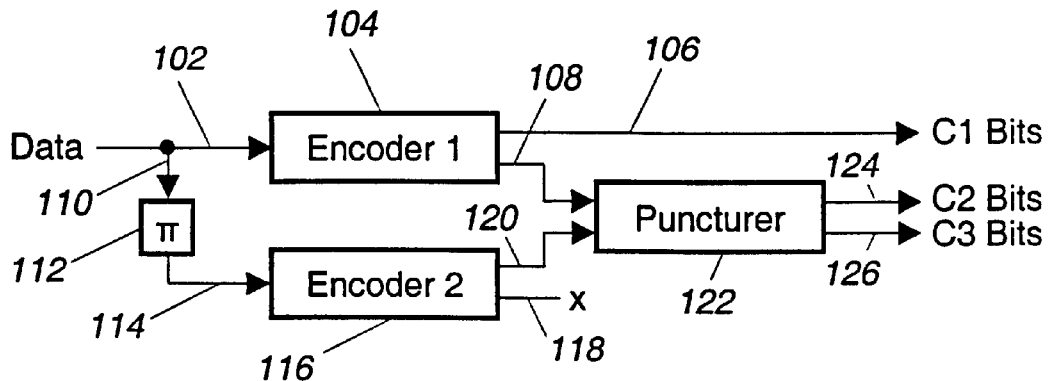
FIG. 1 illustrates the structure of a basic turbo-coding system.

To illustrate a preferred embodiment of the present invention, a data encoding technique known as turbo-coding was chosen. General information regarding turbo-coding can be found in "Continuous Map Algorithms and Their Applications to Decode Parallel and Serial Code Concatenations", *Proceedings of the Fifth European Space Agency Workshop on Digital Signal Processing Techniques Applied to Space Communications*, September 1996, pgs. 8.10–8.24, which is included herein by reference in its entirety. FIG. 1 illustrates a basic turbo-coding system 100. Data to be encoded ("raw data") is applied to the input 102 of a first encoder 104. The first encoder 104 performs a chosen type of encoding on the raw data bits and outputs two sets of bits. The first set of bits output from the first encoder 104 are commonly referred to as systematic bits, which are output from the systematic bit output 106 of the first encoder 104. Systematic bits are directly representative of the information contained in the raw data. The systematic bits output from the first encoder 104 will also be referred to as the C1 bits. The second set of bits output from the first encoder 104 are commonly referred to as parity bits, which are output from the parity bit output 108 of the first encoder 104. Parity bits are a function of the states of the raw data bits.

The raw data is also applied to the input 110 of a permuter 112. A permuter is a device which rearranges bits, typically in a random manner. The permuter 112 rearranges the raw data bits. The rearranged raw data bits output from the permuter 112 are then applied to the input 114 of a second encoder 116. The second encoder 116 may be the same type of encoder as the first encoder 104. As with the first encoder 104, the second encoder 116 outputs two sets of bits. Systematic bits are output from the systematic bit output 118 of the second encoder 116, and parity bits are output from the parity bit output 120 of the second encoder 116. The systematic bits output from the second encoder 116 are typically discarded since they generally contain the same information as the systematic bits output from the first encoder 104. The parity bits, however, are retained since they represent unique and important information.

The parity bits output from the first encoder 104 parity bit output 108 are input to a puncturer 122. Likewise, the parity bits output from the second encoder 116 parity bit output 120 are input to the puncturer 122. A puncturer is a device which compresses data, thereby eliminating unnecessary information. The puncturer 122 compresses the input parity bits in order to make more efficient use of communication channel bandwidth. The puncturer 122 output bits corresponding to compressed parity bits from the first encoder 104 are output from the first puncturer output 124. The puncturer 122 output bits corresponding to compressed parity bits from the first encoder 104 will also be referred to as "the C2 bits". The puncturer 122 output bits corresponding to compressed parity bits from the second encoder 116 are output from the second puncturer output 126. The puncturer 122 output bits corresponding to compressed parity bits from the second encoder 116 will also be referred to as "the C3 bits". Prior to being modulated and transmitted over a communication channel, the C1 bits, C2 bits and C3 bits will be combined in some manner to form a serial bit stream.

Figure 2:
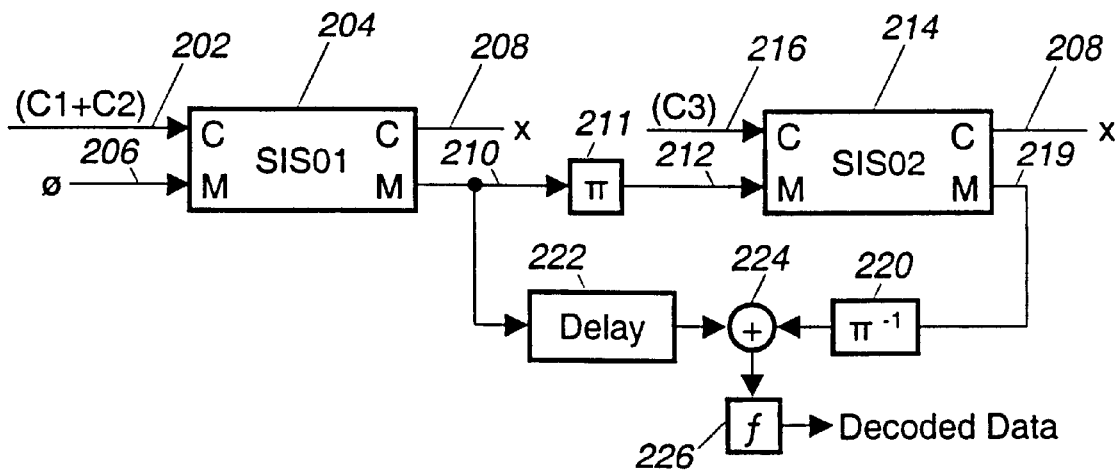
FIG. 2 illustrates the structure of a basic turbo-decoding system.

On the receiving end of the communication channel, the signal is demodulated and must be decoded to extract the original raw data. FIG. 2 illustrates a basic turbo decoder 200 that will serve to develop basic turbo decoder concepts, an understanding of which will assist in understanding the subsequent discussion.

The systematic bits (C1 bits) and first set of parity bits (C2 bits) of turbo-encoded data are applied to the data input 202 of a first Soft-Input-Soft-Output ("SISO") decoder 204. The metrics input 206 of the first SISO decoder 204 has a null input applied. The data output 208 of the first SISO decoder 204 is discarded. The metrics output 210 of the first SISO decoder 204 is applied to the input of a permuter 211. The permuter 211 rearranges the bits of the input metric and applies the result to the metrics input 212 of a second SISO decoder 214. The second set of parity bits (C3 bits) are applied to the data input 216 of the second SISO decoder 214. The second SISO decoder 214 performs a decoding operation based on the C3 bits and the metric bits from the permuter 211, which are permuted metric bits, originally output from the first SISO decoder 204. The data output 218 of the second SISO decoder 214 is discarded. The metrics output 219 of the second SISO decoder 214 is applied to the input of an inverse-permuter 220. An inverse-permuter is in essence a permuter set up to restore permuted bits to their pre-permuted order. For example, if bit sequence A is permuted by a permuter to form bit sequence B, an inverse permuter would restore bit sequence B back to bit sequence A.

In addition to being applied to the input of the permuter 211, the metrics output 210 of the first SISO decoder 204 is applied to a delay circuit 222. The output of the delay circuit 222 and the output of the inverse-permuter 220 are applied to inputs of an adder 224. The output of the adder 224 is applied to the input of a data decision processor 226 which outputs a bit stream of decoded data corresponding to the original raw data.

Figure 3:
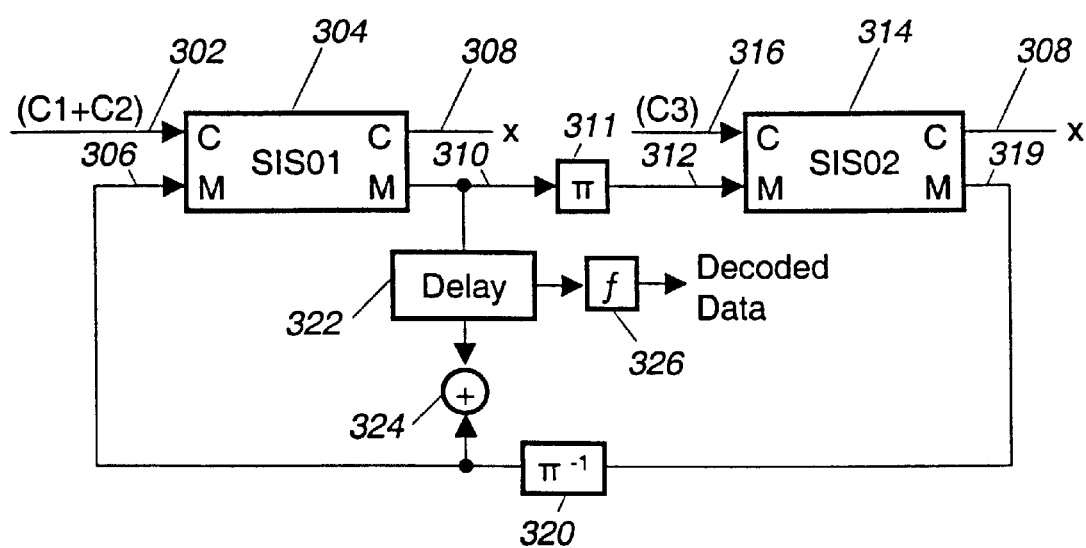
FIG. 3 illustrates an iterative turbo-decoding system with a single decoder processor.

The example decoder illustrated in FIG. 2, and discussed above, often does not provide adequately decoded data in one pass. It is typically utilized in an iterative architecture 300 as shown in FIG. 3. In an iterative type of decoding system, an output metric resulting from a decoding iteration will typically be fed back to the metrics input of a decoder. The encoded data will then be decoded repeatedly with better and better metrics until the metrics converge to values corresponding to high confidence levels. The total number of decoding iterations necessary to achieve the desired confidence level is typically a predetermined value.

Comparing the decoding schemes illustrated in FIGS. 2 and 3, the only architectural difference is a metric feedback path from the output of the inverse-permuter (220 in FIG. 2, 320 in FIG. 3) to the input of the first SISO decoder (206 in FIG. 2, 306 in FIG. 3).

Referring to the decoder processor 300 illustrated in FIG. 3, the systematic bits (C1 bits) and first set of parity bits (C2 bits) of turbo-encoded data are applied to the data input 302 of a first Soft-Input-Soft-Output ("SISO") decoder 304. The metrics input 306 of the first SISO decoder 304 is connected to the output from the inverse-permuter 320. The data output 308 of the first SISO decoder 304 is discarded. The metrics output 310 of the first SISO decoder 304 is applied to the input of a permuter 311. The permuter 311 rearranges the bits of the input metric and applies the result to the metrics input 312 of a second SISO decoder 314. The second set of parity bits (C3 bits) are applied to the data input 316 of the second SISO decoder 314. The second SISO decoder 314 performs a decoding operation based on the C3 bits and the metric bits from the permuter 311, which are permuted metric bits from the first SISO decoder 304. The data output 318 of the second SISO decoder 314 is discarded. The metrics output 319 of the second SISO decoder 314 is applied to the input of the inverse-permuter 320.

In addition to being applied to the input of the permuter 311, the metrics output 310 of the first SISO decoder 304 is applied to a delay circuit 322. The output of the delay circuit 322 and the output of the inverse-permuter 320 are applied to inputs of an adder 324. The output of the adder 324 is applied to the input of a data decision processor 326 which outputs a bit stream of decoded data corresponding to the original raw data.

As stated earlier, the output of the inverse-permuter 320 is connected to the metrics input 306 of the first SISO decoder 304. Thus, the decoder processor 300 performs the nth decoding iteration with an input metric resulting from the (n−1)th decoding iteration. The total number of iterations is typically pre-determined. However, there may be instances where flexibility is designed into an architecture to enable an adaptable number of iterations to be performed.

As mentioned in the background section, a weakness of the single decoder processor/multiple iteration decoding scheme is that the decoder processor 300 must complete the iterative decoding processing as fast as the encoded data is arriving. Thus for an n-iteration decoding scheme, the decoder processor 300 must process a decoding iteration n-times as fast as the data is arriving. A pipelined solution to this problem utilizing cascaded decoder processors is illustrated in FIG. 4.

Figure 4:
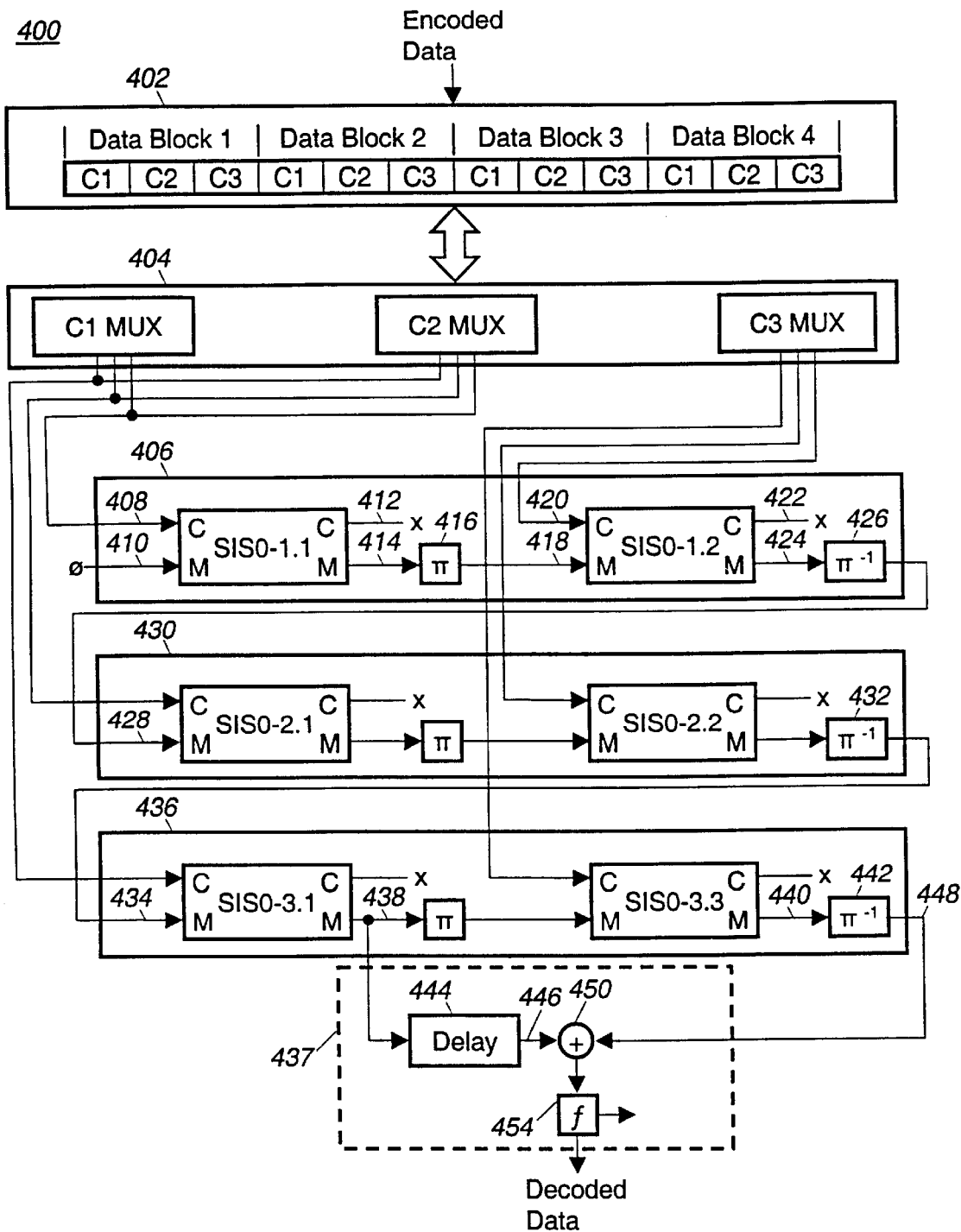
FIG. 4 illustrates a pipelined iterative turbo-decoding system according to a preferred embodiment of the present invention.

FIG. 4 illustrates an embodiment 400 of the present invention applied to the particular problem of iteratively decoding data encoded with turbo coding. The particular embodiment 400 illustrated is for iteratively decoding data by performing three decoding iterations. The example may be extended to include as many decoding iterations and cascaded decoder processors as necessary.

Encoded data may be stored in consecutive data blocks as the encoded data arrives. The multiple-block memory 402 of the embodiment illustrated in FIG. 4 is divided into four data blocks, Data Block 1, Data Block 2, Data Block 3 and Data Block 4. Each data block is logically and/or physically divided into three sections, C1, C2 and C3. C1 sections store systematic bits, C2 sections store first sets of parity bits, and C3 sections store second sets of parity bits.

A multiplexing and data control block 404 controls decoder processor access to the encoded data in the memory 402. In the embodiment illustrated in FIG. 4, the multiplexing and data control block 404 is divided into three sections. The first section, C1 MUX, controls access to C1 sets of systematic bits. The second section, C2 MUX, controls access to C2 first sets of parity bits. The third section, C3 MUX, controls access to C3 second sets of parity bits.

The embodiment illustrated in FIG. 4 shows three cascaded decoder processors (406, 430, and 436). The data input 408 of the first decoder SISO-1.1 of the first decoder processor 406 initially receives data from the C1 and C2 sections of Data Block 1, via C1 MUX and C2 MUX respectively. The metric input 410 of SISO-1.1 receives a null input since the first decoder processor 406 is the first decoder processor in the cascade of decoder processors. SISO-1.1 performs a decoding operation and produces two outputs, a data output 412 and a metric output 414. The data output 412 from SISO-1.1 is discarded. The metric output 414 from SISO-1.1 is input to the permuter 416 of the first decoder processor 406. The permuter 416 rearranges its input bits and sends them to the metric input 418 of the second decoder SISO-1.2 of the first decoder processor 406.

The data input 420 of SISO-1.2 initially receives data from the C3 section of Data Block 1 via C3 MUX. SISO-1.2 performs a decoding operation and produces two outputs, a data output 422 and a metric output 424. The data output 422 from SISO-1.2 is discarded. The metric output 424 of SISO-1.2 is input to the inverse-permuter 426 of the first decoder processor 406. The inverse-permuter 426 rearranges its input bits, which are the metric bits output from SISO-1.2, in a manner that is inverse to the bit rearrangement performed by the permuter 416 and sends the rearranged input metric bits to the metric input 428 of SISO-2.1 of the second decoder processor 430.

While the first decoder processor 406 is performing its decoding iteration on the encoded data stored in Data Block 1, newly arriving encoded data is stored in Data Block 2. When the first decoder processor 406 completes its decoding iteration of the encoded data in Data Block 1, resulting in the sending of the metrics from the inverse-permuter 426 of the first decoder processor 406 to the metrics input 428 of SISO-2.1 of the second decoder processor 430, the decoder processing of a next iteration begins. The multiplexing and data control block 404 now grants the second decoder processor 430 access to Data Block 1 and grants the first decoder processor 406 access to a new block of data, Data Block 2. As the second decoder processor 430 performs the second decoding iteration to be performed on the encoded data in Data Block 1, the first decoder processor 406 performs the first decoding iteration to be performed on the encoded data in Data Block 2. The decoding iteration performed by the first decoder processor 406 on the encoded data in Data Block 2 follows the discussion above regarding the decoding iteration performed by the first decoder processor 406 on Data Block 1.

The second decoder processor 430 performs the second decoding iteration to be performed on the encoded data in Data Block 1 in a manner similar to the first decoding iteration performed by the first decoder processor 406. An important difference between the first decoder processor 406 and the second decoder processor 430 is that the metric input 410 of the first decoder, SISO-1.1, of the first decoder processor 406 received a null input. As discussed above, the reason for this is that the first decoder processor 406 is the first decoder processor in the cascade, and therefore has no preceeding decoder processor from which to receive metric information. However, the metric input 428 of the first decoder, SISO-2.1, of the second decoder processor 430 receives metric information output from the inverse permuter 426 of the first decoder processor 406. Except for the metric input difference just discussed, the second decoder processor 430 performs the second decoding iteration on the encoded data in Data Block 1 in the same manner as discussed previously regarding the first decoder processor 406.

While the first decoder processor 406 is performing its respective decoding iteration on the encoded data in Data Block 2 and the second decoder processor 430 is performing its respective decoding iteration on the encoded data in Data Block 1, newly arriving encoded data is stored in Data Block 3. When the first decoder processor 406 completes the first decoding iteration on the encoded data in Data Block 2, and the second decoder processor 430 completes the second decoding iteration on the encoded data in Data Block 1, the decoder processing of a next iteration begins. The output metrics from the inverse-permuter 426 of the first decoder processor 406 are applied to the metrics input 428 of the first decoder, SISO-2.1, of the second decoder processor 430. The output metrics from the inverse-permuter 432 of the second decoder processor 430 are applied to the metrics input 434 of the first decoder, SISO-3.1, of the third decoder processor 436.

The multiplexing and data control block 404 now grants the third decoder processor 436 access to Data Block 1, grants the second decoder processor 430 access to Data Block 2, and grants the first decoder processor 406 access to a new block of data, Data Block 3. As the third decoder processor 436 performs the third decoding iteration to be performed on the encoded data in Data Block 1, the second decoder processor 430 performs the second decoding iteration to be performed on the encoded data in Data Block 2, and the first decoder processor 406 performs the first decoding iteration to be performed on the encoded data in Data Block 3. The decoding iteration performed by the first decoder processor 406 on the encoded data in Data Block 3 follows the discussion above for the decoding iteration performed by the first decoder processor 406 on Data Block 1. The decoding iteration performed by the second decoder processor 430 on the encoded data in Data Block 2 follows the discussion above for the decoding iteration performed by the second decoder processor 430 on Data Block 1.

The third decoder processor 436 performs the third decoding iteration to be performed on the encoded data in Data Block 1 in a manner very similar to the second decoding iteration performed by the second decoder processor 430 on Data Block 1. An important difference is that the metric input 428 of the first decoder, SISO-2.1, of the second decoder processor 430 receives the output metric from the inverse-permuter 426 of the first decoder processor 406, and the metric input 434 of the first decoder, SISO-3.1, of the third decoder processor 436 receives the output metric from the inverse permuter 432 of the second decoder processor 430. Except for the metric input difference just discussed, the third decoder processor 436 performs the third decoding iteration on the encoded data in Data Block 1 in the same manner as discussed previously regarding the second decoder processor 430.

As the third decoder processor 436 performs the third decoding iteration on Data Block 1, the metric output data from SISO-3.1 and the metric output data from SISO-3.2

(through inverse-permuter 442) is synchronized, added, and analyzed by a data decision element 437 to produce the final set of decoded data corresponding to the encoded data in Data Block 1. The metric output 438 from SISO-3.1 is connected to a delay element 444. The metric output 440 from SISO-3.2 is connected to the inverse-permuter 442 of the third decoder processor 436. The delay element 444 output 446 and the inverse-permuter 442 output 448 are connected to an adder 450. The adder 450 output 452 is connected to the input of a decision processor 454. The output of the decision processor 454 is the decoded data corresponding to the encoded data in Data Block 1. Now that the encoded data in Data Block 1 has been decoded, the memory space in Data Block 1 is made available for storing the next block of encoded data received.

While the first decoder processor 406 is performing its respective decoding iteration on the encoded data in Data Block 3, and the second decoder processor 430 is performing its respective decoding iteration on the encoded data in Data Block 2, and the third decoder processor 436 is performing its respective decoding iteration on the encoded data in Data Block 1, newly arriving encoded data is stored in Data Block 4. When the first decoder processor 406 completes the first decoding iteration on the encoded data in Data Block 3, and the second decoder processor 430 completes the second decoding iteration on the encoded data in Data Block 2, and the third decoder processor 436 completes the third decoding iteration on the encoded data in Data Block 1, the decoder processing of a next iteration begins.

The multiplexing and data control block 404 now grants the third decoder processor 436 access to Data Block 2, grants the second decoder processor 430 access to Data Block 3, and grants the first decoder processor 406 access to a new block of data, Data Block 4. As the third decoder processor 436 performs the third decoding iteration to be performed on the encoded data in Data Block 2, the second decoder processor 430 performs the second decoding iteration to be performed on the encoded data in Data Block 3, and the first decoder processor 406 performs the first decoding iteration to be performed on the encoded data in Data Block 4. The decoding iterations and final data decision processing follow the previous discussion. While this next round of decoding iterations are performed on the encoded data in Data Block 2, Data Block 3 and Data Block 4, newly arriving encoded data is stored in Data Block 1. The iterative decoding cycle discussed above continues until all of the encoded data received is decoded.

Figure 5:
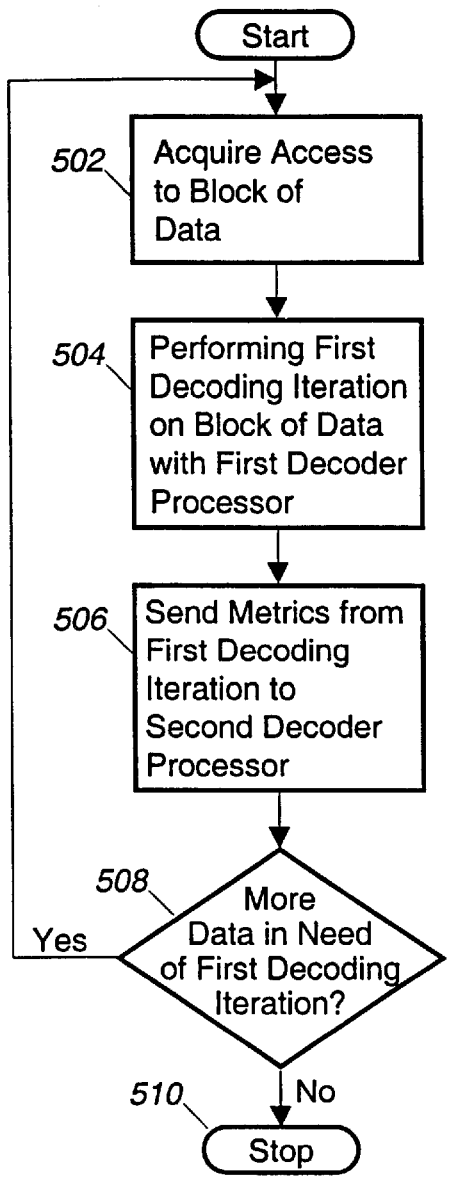
FIG. 5 illustrates a method for iteratively decoding encoded data performed by a first cascaded decoder processor according to a preferred embodiment of the present invention.

FIGS. 5, 6, 7 and 8 illustrate a method according to a preferred embodiment of the present invention for iteratively decoding encoded data using cascaded decoder processors. FIG. 5 illustrates the method 500 followed by the first decoder processor in the cascade. As encoded data arrives, the first decoder processor in the cascade acquires access 502 to the memory block in which the encoded data is stored. The first decoder processor in the cascade then performs the first decoding iteration 504 on the block of data. The metrics resulting from the first decoding iteration are then sent 506 to the second decoder processor in the cascade. A decision 508 is then made. If there are more blocks of encoded data to be decoded with the first decoding iteration, the process begins again at the data access acquisition step 502. If there are no more blocks of encoded data to be decoded with the first decoding iteration, the processing of first decoding iterations is complete 510.

Figure 6:
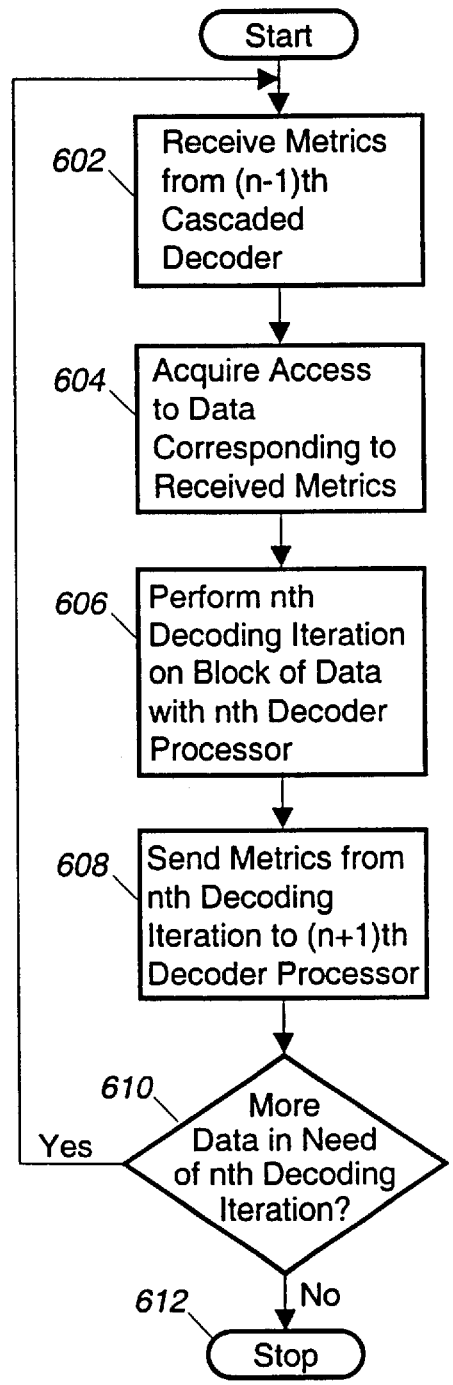
FIG. 6 illustrates a method for iteratively decoding encoded data performed by a middle cascaded decoder processor according to a preferred embodiment of the present invention.

FIG. 6 illustrates the method 600 followed by the nth decoder processor in the cascade, where the nth decoder processor is not the first or last decoder processor in the cascade. The nth decoder processor receives metrics 602 from the (n−1)th decoder processor in the cascade. The nth decoder processor then acquires access 604 to the data block corresponding to the received metrics. The nth decoder processor in the cascade then performs the nth decoding iteration 606 on the block of data. The metrics resulting from the nth decoding iteration are then sent 608 to the (n+1)th decoder processor in the cascade. A decision 610 is then made. If there are more blocks of encoded data to be decoded with the nth decoding iteration, the process begins again at the metrics receiving step 602. If there are no more blocks of encoded data to be decoded with the nth decoding iteration, the processing of nth decoding iterations is complete 612.

Figure 7:
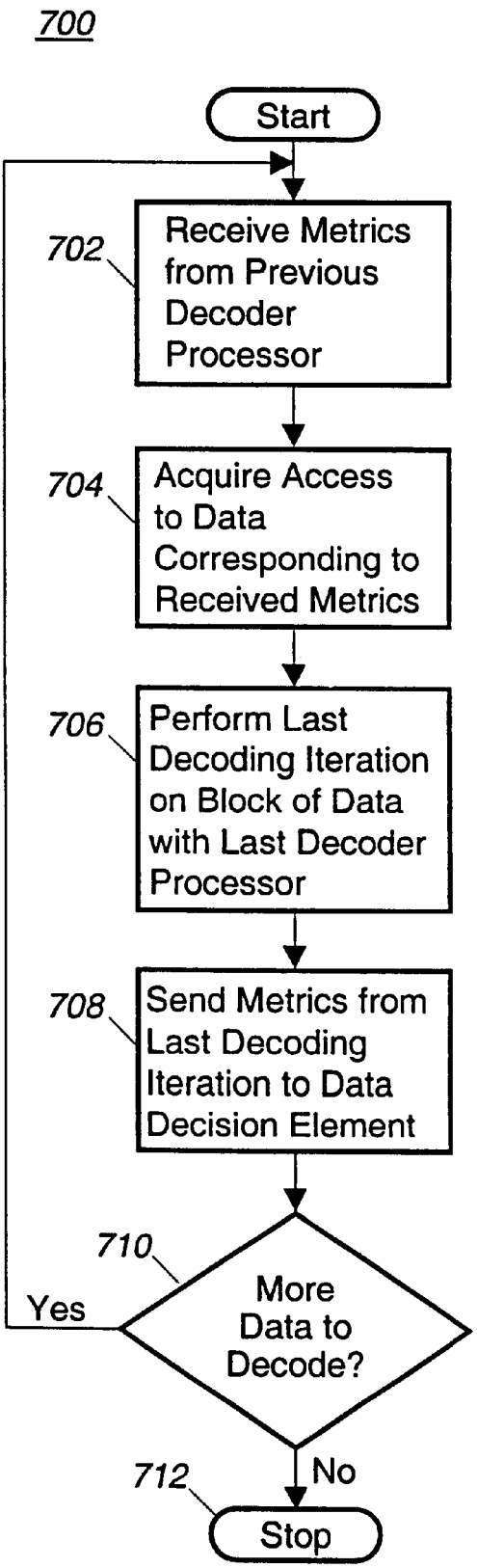
FIG. 7 illustrates a method for iteratively decoding encoded data performed by a last cascaded decoder processor according to a preferred embodiment of the present invention.

FIG. 7 illustrates the method 700 followed by the last decoder processor in the cascade. The last decoder processor receives metrics 702 from the next-to-last decoder processor in the cascade. The last decoder processor then acquires access 704 to the data block corresponding to the received metrics. The last decoder processor in the cascade then performs the last decoding iteration 706 on the block of data. The metrics resulting from the last decoding iteration are then sent 708 to a data decision element. A decision 710 is then made. If there are more blocks of encoded data to be decoded with the last decoding iteration, the process begins again at the metrics receiving step 702. If there are no more blocks of encoded data to be decoded with the last decoding iteration, the processing of last decoding iterations is complete 712.

The processing performed by the first cascaded decoder processor, nth cascaded decoder processor, and last cascaded decoder processor were discussed separately. However, it should be understood that although the decoding iterations on a given block of data are performed sequentially, decoding iterations are performed on different blocks of data simultaneously. For example, while a first block of data is being decoded with a third decoding iteration, a second block of data is being decoded with a second decoding iteration, and a third block of data is being decoded with a first iteration.

The metrics resulting from the last decoding iteration that are sent 708 to the data decision element are analyzed by the data decision element to produce the final output decoded data. The analysis performed by the data decision element may consist of a parity test, where the arithmetic sign of a metric indicates the bit value of the corresponding decoded output bit. The output of the data decision element is preferably a bit stream of decoded data.

Figure 8:
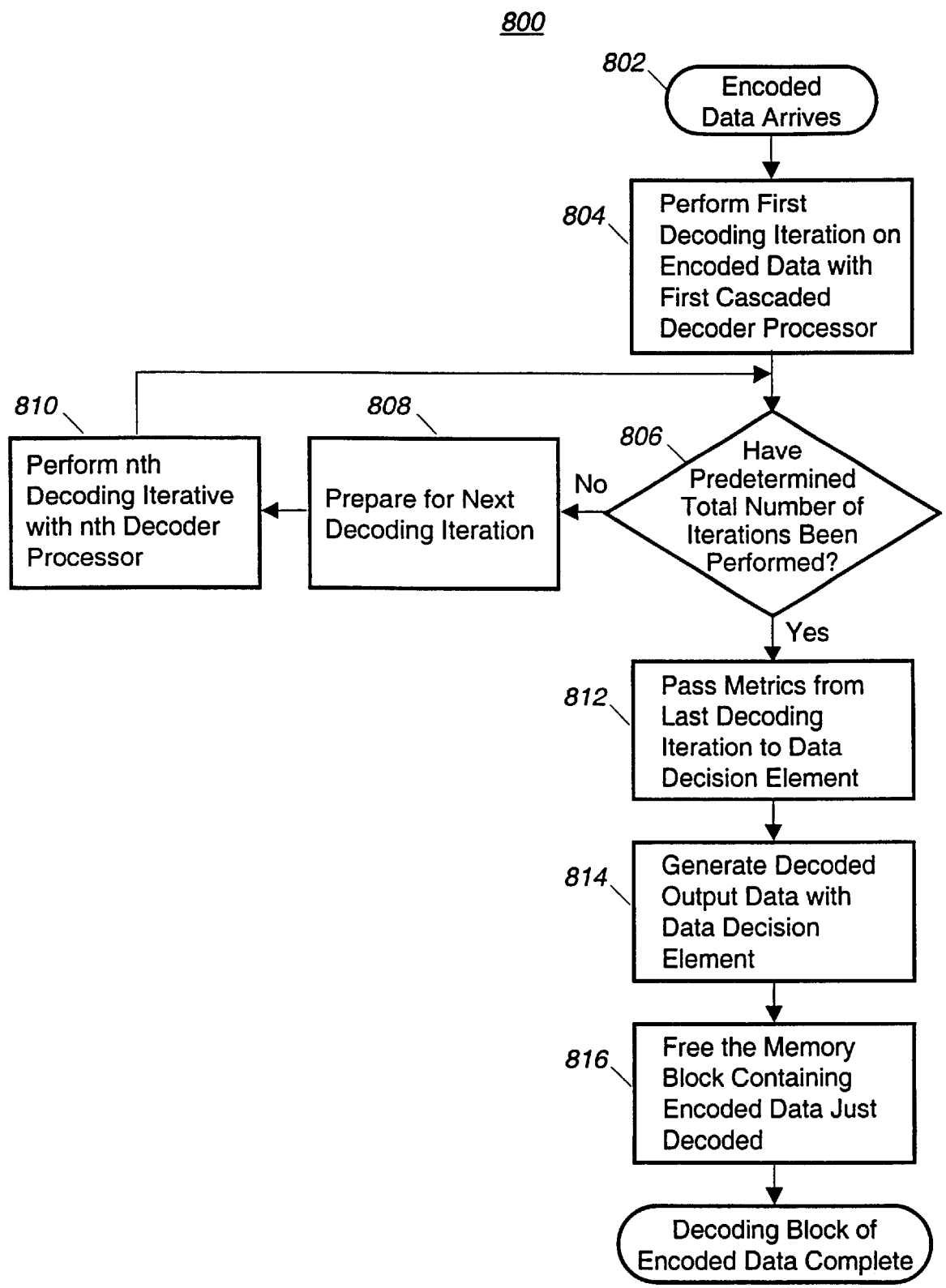
FIG. 8 illustrates a method for iteratively decoding a block of encoded data according to a preferred embodiment of the present invention.

FIGS. 5, 6 and 7 illustrate a method for iteratively decoding encoded data using cascaded decoder processors from the perspective of the cascaded decoder processors. FIG. 8 illustrates the method 800 for iteratively decoding encoded data using cascaded decoder processors from the perspective of a block of encoded data. The arrival of a block of encoded data 802 initiates the decoding process. A first decoding iteration 804 is performed on the block of encoded data using a first decoder processor. A done decision 806 is then made based on the number of decoding iterations performed so far on the block of encoded data relative to the predetermined total number of decoding iterations that are to be performed. If there are remaining decoding iterations to be performed on the block of encoded data, preparations 808 are made for the next decoding iteration to be performed. The preparations consist of providing the next cascaded decoder processor performing the next decoding iteration with the output metrics from the most recent decoding iteration and with access to the encoded data block being decoded. The next decoding iteration 810 is then performed on the block of encoded data. The done decision 806 is then made again. The preparation 808 and decoding iteration 810 steps are performed repeatedly until the done decision 806 determines that the predetermined total number of decoding iterations to be performed on the encoded data block have been performed. Once this decision is made, the metrics from the last decoding iteration are passed 812 to a data decision element. Decoded output data is then generated 814 by the data decision element based on the metrics passed to it. Since the encoded data is no longer needed after it is decoded, the memory block containing the encoded data is made available for other data 816. Although the decoding iteration step 810, last metric passing step 812, and output generating step 814 are illustrated sequentially in FIG. 8 for a block of encoded data, the metric passing step 812 and output generating step 814 preferably occur simultaneously with the last decoding iteration. This simultaneous processing is possible, because the metrics output from the last decoding iteration are preferably generated in the form of a sequential stream of metrics.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A cascaded processor decoder for decoding encoded data, the decoder comprising:
   a plurality of decoder processors, including a first cascaded decoder processor and a second cascaded decoder processor;
   a metric output of said first cascaded decoder connected to a metric input of said second cascaded decoder processor; and
   a multiple-block memory connected to said decoder processors for storing encoded input data arranged in multiple data blocks.

2. The cascaded processor decoder of claim 1, further comprising a plurality of multiplexers connected between said decoder processors and said memory, said multiplexers allowing any decoder processor to selectively access any data block in said memory.

3. The cascaded processor decoder of claim 1, further comprising a data decision element for generating decoded output data, said data decision element connected to said second cascaded decoder processor.

4. The cascaded processor decoder of claim 1, further comprising:
   a plurality of multiplexers connected between said decoder processors and said memory, said multiplexers allowing any decoder processor to access any data block in said memory; and
   a data decision element for generating decoded output data, said data decision element connected to said second cascaded decoder processor.

5. The cascaded processor decoder of claim 1, further comprising:
   at least one multiplexer randomly accessing a data block of said multiple-block memory.

6. A cascaded processor decoder for iteratively decoding data, the decoder comprising:
   a plurality of decoder processors equal in number to a predetermined number of decoding iterations, said decoder processors including at least a first cascaded decoder processor and a second cascaded decoder processor;
   a metric output of said first cascaded decoder processor connected to a metric input of said second cascaded decoder processor;
   a multiple-block memory comprising data blocks at least equal in number to said decoder processors;
   a plurality of multiplexers connected between said data blocks and said decoder processors, said multiplexers allowing said decoder processors to selectively access any of said data blocks; and
   a data decision element for generating decoded output data, said data decision element connected to said second cascaded decoder processor.

7. The cascaded processor decoder of claim 6 wherein each of said data blocks comprise:
   a systematic bits section;
   a first parity bits section; and
   a second parity bits section.

8. The cascaded processor decoder of claim 7 wherein each of said decoder processors comprise:
   a first decoder connected to a first data block including an associated systematic bits section and an associated first parity bits section;
   a permuter connected to a metric output of said first decoder;
   a second decoder connected to said first data block including an associated second parity bits section, said second decoder connected to an output of said permuter; and
   an inverse permuter connected to a metric output of said second decoder.

9. The cascaded processor decoder of claim 8, wherein said data decision element comprises:
   a delay element connected to a metric output of said first decoder of said second cascaded decoder processor;
   an adder connected to an output of said delay element, said adder connected to an output of said inverse permuter of said second cascaded decoder processor;
   a data decision processor connected to an output of said adder, said data decision processor including a decoded data bit output.

10. A method for iteratively decoding encoded data using a predetermined total number of decoding iterations, the method comprising:
    receiving encoded data into a data block in a multiple-block memory;
    accessing the encoded data in the data block by a first decoder processor through a plurality of multiplexers; and
    iteratively decoding said encoded data a predetermined total number of times with said cascaded decoder processors.

11. The method for iteratively decoding encoded data of claim 10, further comprising:
    generating an output bit stream of decoded encoded data with a data decision element.

12. The method for iteratively decoding encoded data of claim 10, wherein said step of iteratively decoding comprises iteratively decoding among at least two interconnected cascaded decoder processors.

13. The method for iteratively decoding encoded data of claim 10, wherein said step of iteratively decoding comprises decoding at most one iteration on each of said cascaded decoder processors.

14. The method for iteratively decoding encoded data of claim 10, wherein said step of iteratively decoding comprises:

performing a first number of decoding iterations on said encoded data with a first decoder processor, and generating first resultant metrics;

passing said first resultant metrics to a second decoder processor;

accessing the encoded data in the data block by the second decoder processor through a plurality of multiplexers;

performing a second number of decoding iterations on said encoded data and first resultant metrics with a second decoder processor and generating second resultant metrics; and passing said second resultant metrics to a third decoder processor.

15. The method for iteratively decoding encoded data of claim 14, further comprising:

performing a last decoding iteration with a last decoder processor, and generating last resultant metrics;

passing said last resultant metrics from said last decoder processor to a data decision element; and performing data decisions with said data decision element.

16. The method for iteratively decoding encoded data of claim 15 wherein said step of performing data decisions comprises generating decoded data based on a polarity of said last resultant metrics.

17. The method for iteratively decoding encoded data of claim 15, wherein said step of generating last resultant metrics comprises:

generating a first subset;

generating a second subset; and generating said last resultant metrics by adding said first subset to said second subset.

18. The method for iteratively decoding encoded data of claim 17 wherein said step of performing data decisions comprises generating decoded data based on a polarity of said last resultant metrics.

* * * * *